United States Patent [19]
Sato et al.

[11] Patent Number: 4,729,116
[45] Date of Patent: Mar. 1, 1988

[54] BIPOLAR PROGRAMMABLE READ ONLY MEMORY ATTAINING HIGH SPEED DATA READ OPERATION

[75] Inventors: Hiroaki Sato; Hiroshi Mayumi, both of Tokyo, Japan

[73] Assignee: NEC Corporation, Tokyo, Japan

[21] Appl. No.: 800,866

[22] Filed: Nov. 22, 1985

[30] Foreign Application Priority Data

Nov. 22, 1984 [JP] Japan .............................. 59-247109

[51] Int. Cl.⁴ .............................................. G11C 7/00
[52] U.S. Cl. ...................................... 365/189; 365/96
[58] Field of Search ................. 365/189, 230, 94, 103, 365/104, 105, 96

[56] References Cited

U.S. PATENT DOCUMENTS 3,969,706   7/1976   Proebsting et al. ................. 365/189

*Primary Examiner*—Joseph A. Popek
*Attorney, Agent, or Firm*—Sughrue, Mion, Zinn, Macpeak and Seas

[57] ABSTRACT

A bipolar programmable read only memory device having improved data read speed is disclosed. Each of memory cells has one end connected to a reference potential point and the other end connected to a data write circuit so as to receive a programming current. A data read circuit is electrically isolated from the other end of each memory cell in a data write operation mode. In the data read operation mode, the memory cell is electrically coupled to the data read circuit.

16 Claims, 8 Drawing Figures

FIG. I
PRIOR ART

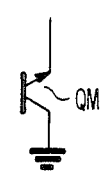
FIG 4A
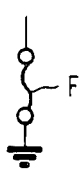
FIG 4B
FIG 5
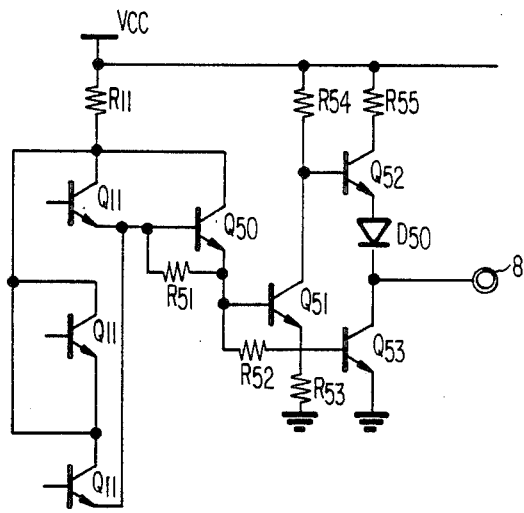
FIG 6A
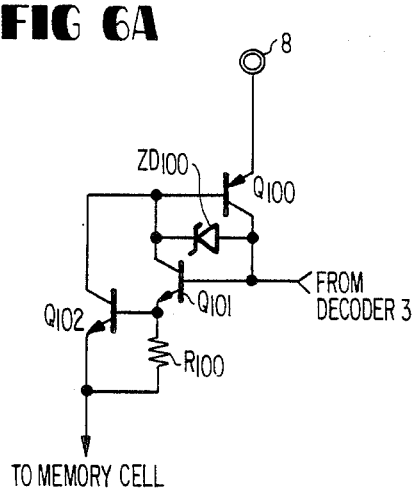
FIG 6B
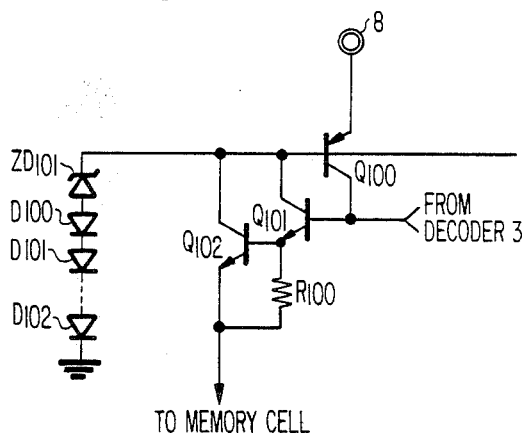

BIPOLAR PROGRAMMABLE READ ONLY MEMORY ATTAINING HIGH SPEED DATA READ OPERATION

BACKGROUND OF THE INVENTION

The present invention relates to a programmable read only memory device (called hereinafter as a "PROM"), and more particularly to a high speed bipolar PROM.

A memory cell in a bipolar PROM is composed of a transistor of a base open type or a fuse. On a data write operation, the selected memory cell is supplied with a programming current having a current value sufficient to break a PN junction of the base open transistor or to blow the fuse, so that both ends of the memory cell are subjected to be a short-circuit state or an open state.

In the bipolar PROM according to prior art, one end of the memory cell is connected to a bit line and its other end is connected to a word line. Therefore, the programming current having a relatively large value flows from the bit line into the word line via the selected memory cell in order to write a data therein. The programming current should not be supplied to the unselected memory cells. For this purpose, the word lines connected to the unselected memory cells are brought into a current blocking state. Accordingly, a word line driver coupled to the word lines is required, which brings the selected word line into a current drawing state and the remaining word lines into the current blocking state in response to address decode signals from an address decoder.

In a data read operation, a predetermined word line is selected in response to address signals, so that the output data are read out from the memory cells designated by the selected word line.

However, the word line driver is present between the address decoder and the word lines in the prior art. For this reason, the delay caused by the word line driver occurs inevitably from a time point when the application of address signals is initial to a time point when one of the word lines is activated. As a result, a high speed in the data read operation is restricted. In recent years, construction of a bipolar PROM in a gate-array device has been tried, but this has not achieved practical use because of the absence of the bipolar PROM attaining a data read operation at a high speed.

SUMMARY OF THE INVENTION

It is an object of the present invention to provide a PROM achieving a high speed data read operation.

It is another object of the present invention to provide a bipolar PROM having an improved circuit structure in which a word line driver is not required.

It is still another object of the present invention to provide a bipolar PROM in which the number of gate circuits required for a data read operation is reduced to decrease the delay in the data read operation.

A PROM according to the present invention comprises at least one memory cell having one end connected to a reference terminal, a data write circuit electrically coupled to the other end of the memory cell, a data read circuit, and means for electrically isolating the other end of the memory cell from the data read circuit in a data write mode and for electrically coupling the other end of the memory cell to the data read circuit in a data read mode.

Since one end of the memory cell is connected to the reference terminal, a programming current from the data write circuit flows into the reference terminal via the memory cell. At this time, the data read circuit is isolated electrically from the memory cell, and hence the programming current does not flow through the data read circuit. In the data read mode, the memory cell is electrically coupled to the data read circuit, and therefore the data stored in the memory cell is read out. The data write circuit does not produce the programming current, since a programming power is not supplied in this mode.

Thus, the PROM according to the present invention does not require a word line driver which would be otherwise provided in the PROM of the prior art. Accordingly, the data read speed is increased due to the absence of the delay of the word line driver.

BRIEF DESCRIPTION OF THE DRAWINGS

The above and other objects, advantages and features of the present invention will be apparent from the following description taken in conjunction with the accompanying drawings, in which

FIGS. 4A and 4B are circuit diagrams each representing one memory cell;

FIG. 5 is a circuit diagram of an output inverter shown in FIGS. 2 and 3; and

FIGS. 6A and 6B are circuit diagrams of first and second types showing a data write circuit in FIGS. 2 and 3.

DETAILED DESCRIPTION OF THE PRIOR ART

Figure 1:
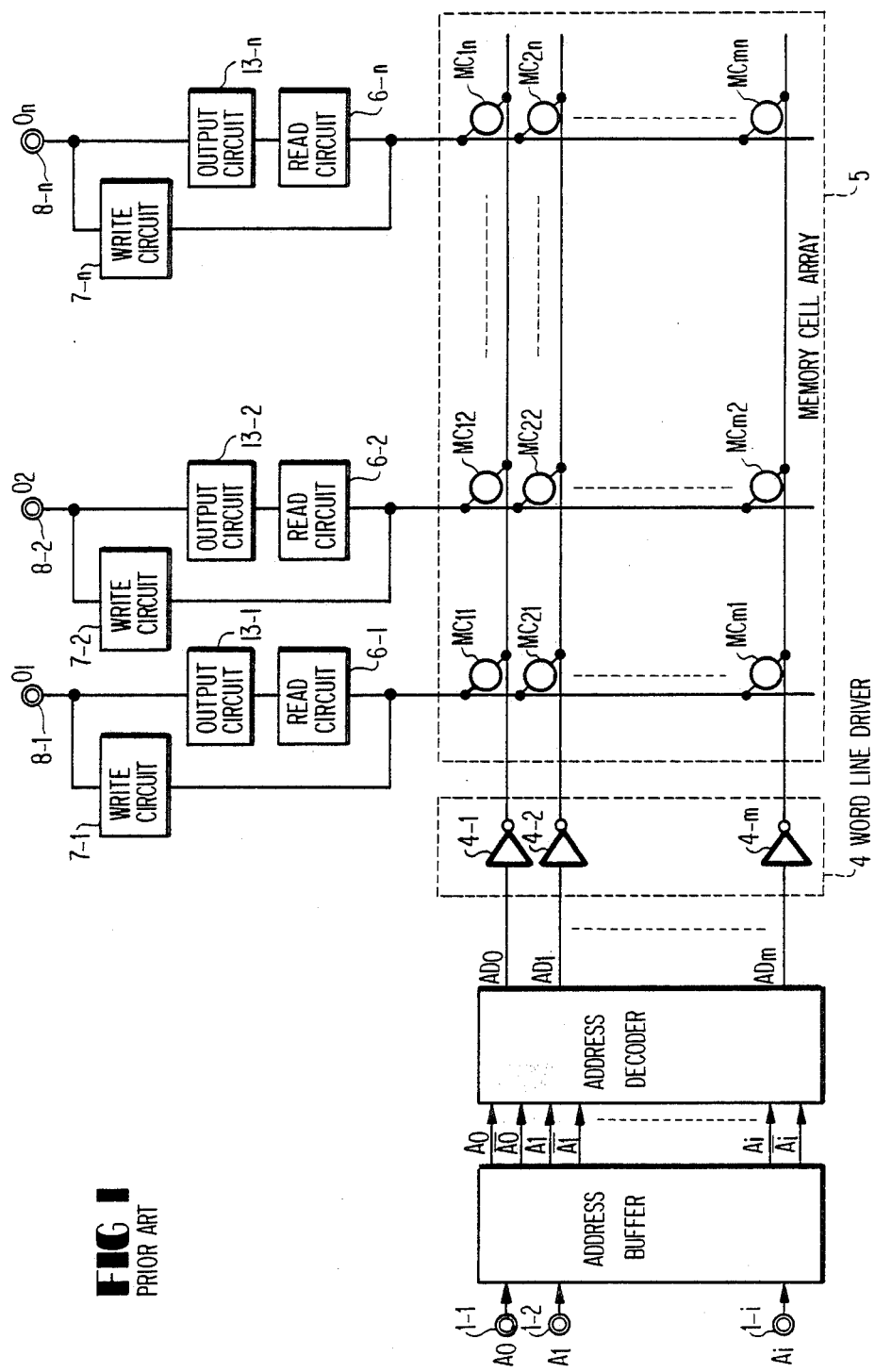
FIG. 1 is a block diagram showing a PROM according to prior art.

Referring to FIG. 1, there is shown a bipolar PROM according to prior art in order to facilitate the understanding of the present invention. A memory cell array 5 includes a plurality of memory cells $MC_{11}$ to $MC_{mn}$, word lines $W_1$ to $W_m$ and bit lines $B_1$ to $B_n$. The memory cell MC is disposed at the intersection of the word and bit lines W and B. The bit lines $B_1$ to $B_n$ are connected to data read circuits 6-1 to 6-n, respectively. The read-out data from the circuits 6-1 to 6-n are supplied to output terminals 8-1 to 8-n through output circuits 13-1 to 13-n each composed of an inverter, respectively. The output terminals 8-1 to 8-n are further connected to data write circuits 7-1 to 7-n, respectively, and a programming current is supplied to the bit lines $B_1$ to $B_n$ therethrough.

In data write operation mode, one of the memory cells MC is selected in response to address signals $A_0$ to $A_i$ supplied to address input terminals 1-1 to 1-i, and the bit line B connected with the selected memory cell MC is supplied with the programming current from the output terminal 8 via the data write circuit 7. The programming current flows into the selected memory cell MC to write a data therein and then reaches the word line. The memory cells other than the selected memory cell are also connected to the same bit line, and they should not be supplied with the programming current. For the purpose of bringing one of the word lines W into a current draw-enabling state and the remaining word lines into a current blocking state, a word line driver 4 is provided. The word line driver 4 is represented by a plurality of inverters 4-1 to 4-n which are connected to the word lines $W_1$ to $W_n$, respectively. The address signals A0 to Ai are supplied to an address buffer 2, so that the true and complementary address signals (A0, $\overline{A0}$), (A1, $\overline{A1}$), ..., (Ai, $\overline{Ai}$) are obtained. These signal are supplied to an address decoder 3 to obtain address decode signals $AD_0$ to $AD_m$. The decode signals $AD_0$ to $AD_m$ are supplied to the inverters 4-1 to 4-m, respectively. As a result, one of the word lines W is brought into the current draw-enabling state to receive the programming current and the remaining word lines are brought into the current blocking state.

In a data read operation mode, one of the word lines W takes an enabling level in response to the address signals to select the memory cells connected thereto. The data read circuits 6-1 to 6-n detect whether or not the selected memory cells are programmed, so that output signals $0_1$ to $0_n$ of data "1" or "0" are derived from the output terminals 8-1 to 8-n.

The word line driver 4 is not necessary in the data read operation, but it is required between the address decoder 3 and the memory cell array 5 in orderto attain the data programming for the respective memory cells MC, as described hereinbefore. As a result, the data read speed is made down by the delay of the driver 4 to restrict a high speed data read.

DETAILED DESCRIPTION OF THE PREFERRED EMBODIMENTS

Figure 2:
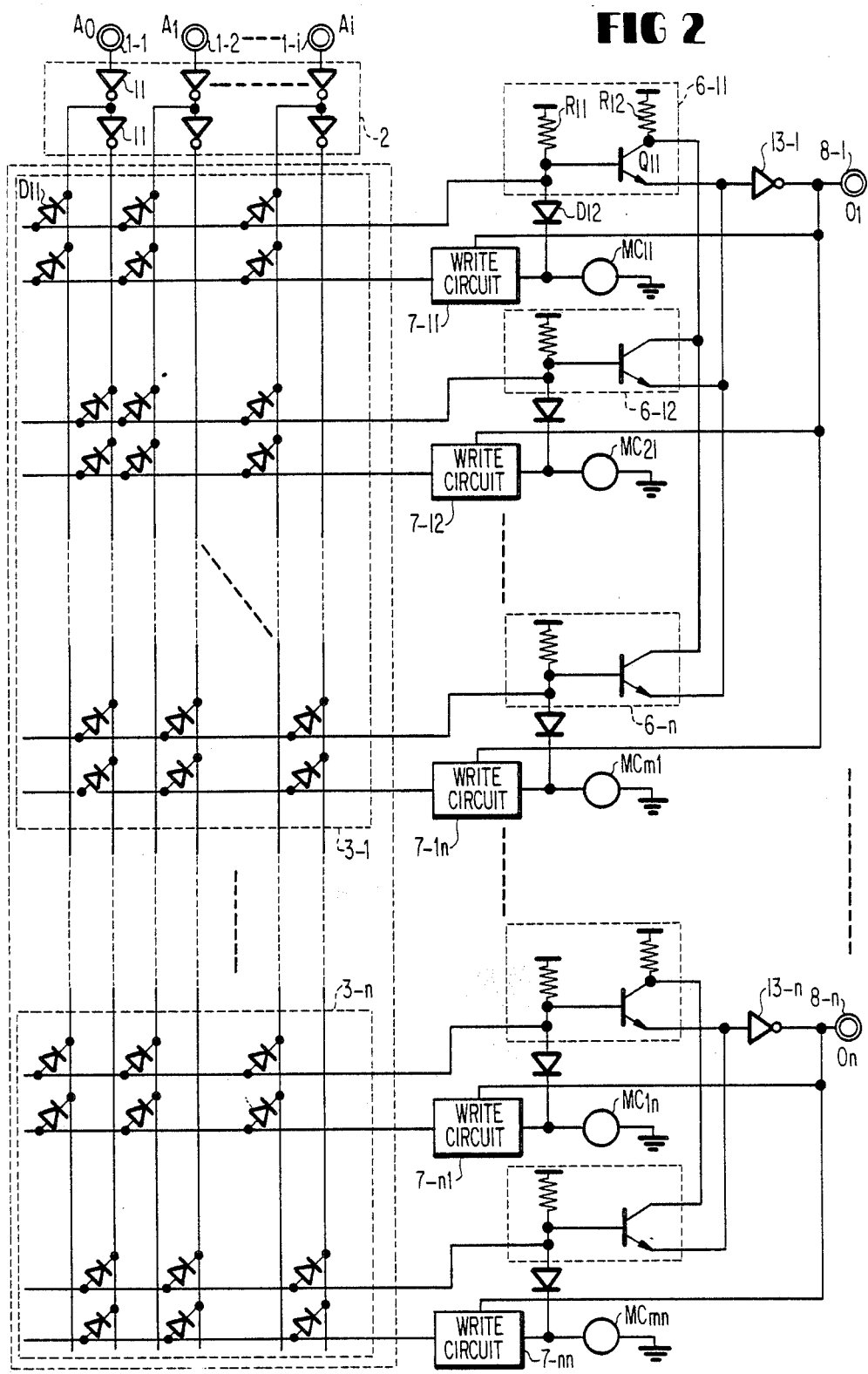
FIG. 2 is a circuit diagram showing an embodiment of the present invention.

Referring to FIG. 2, there is shown a bipolar PROM according to an embodiment of the present invention. As apparent from FIG. 2, one end of each memory cell MC is connected directly to a reference potential point (ground potential point in the embodiment). As a result, the word line drive 4 (FIG. 1) provided in the prior art is deleted.

Address signals A0 to Ai are supplied to an address buffer 2 through address input terminals 1-1 to 1-i. The address buffer 2 includes two inverters 11 connected in series with respect to each address terminal 1 and thus produces true and complementary address signals A and $\overline{A}$. An address decoder 3 is divided into n pieces of blocks 3-1 to 3-n. Each of the decoder blocks 3-1 to 3-n is represented as a diode matrix circuit including a plurality of diodes $D_{11}$ and produces a selecting level (a high level in the embodiment) at one of its output ends. Each output end of the decoder block is connected to the other end of one memory cell MC through a diode $D_{12}$ and further to the other end of a resistor $R_{11}$ as well as the base of a transistor $Q_{11}$ in a data read circuit 6. The collector of the transistor $Q_{11}$ is connected through a resistor $R_{12}$ to a power supply terminal indicated as $V_{CC}$ and its emitter is led out as the output terminal of the data read circut 6. The output terminals of n pieces of the data read circuits are connected in common, and this common connection point is in turn connected through an output inverter 13 to an output terminal 8. The output terminal 8 is also connected with data write circuits 7. The data write circuit 7 is provided with respect to each memory cell MC and its output terminal is connected to the other end of the memory cell MC. The address decoder 3 is also used for the selection of the data write circuit 7, and accordingly, the data write circuit 7 connected to the memory cell to be selected is also selected in response to a set of the address signals A0 to Ai.

As shown in FIG. 4A, each of memory cells MC is composed of a transistor QM of a base open type. The collector of the transistor QM is grounded as one end of the cell MC and its emitter is connected to the cathode of the diode D12 and the output terminal of the data write circuit 7 as the other end of the cell MC. The memory cell MC may be composed of a fuse F, as represented in FIG. 4B.

In a data write operation mode, each decoder block selects one memory cell MC in response to the address signals A0 to Ai and further selects one data write circuit 7 connected to the selected memory cell. When a programming power is, in this condition, applied to the output terminal 8 from an externally provided programming equipment, the selected data write circuit 7 is activated to assume its output terminal at a voltage higher than the power supply voltage $V_{CC}$. As a result, the diode $D_{12}$ connected to the selected memory cell MC is reverse-biased to electrically isolate the data read circuit 6 from the selected memory cell. The data write circuit 7 supplies a programming current to the memory cell MC to break the base-emitter junction of the transistor QM shown in FIG. 4A or to blow the fuse F shown in FIG. 4B. Since one end of the memory cell MC is grounded, the programming current flows into the ground terminal via the memory cell MC. No word line driver is therefore required. The data programming in other memory cells MC is carried out by changing the addres signals A0 to Ai.

A data read operation will be explained below. Also in the data read operation, the data write circuit 7 may be selected. However, no programming power is applied to the output terminal 8, and therefore any data write circuit 7 is not activated. Assuming that the memory cell selected by the decoder block is in the data programmed state, a current path is formed between the base of the transistor $Q_{11}$ and the ground terminal, so that the base of the transistor $Q_{11}$ is clamped at $2V_{BE}$ level (in the case of FIG. 4A) or at $V_{BE}$ level (in the case of FIG. 4B). Accordingly, the transistor $Q_{11}$ is brought into a cut-off state to take a low level at its emitter. The output terminal 8 takes a high level (a data "1") by the output inverter 13. If the selected memory cell is not written, the base of the transistor $Q_{11}$ assumes the high level, so that the output signal of the low level (data "0") is produced by the output inverter 13. The period from a time point at which the address signals A0 to Ai are applied or changed to a time point at which an output data signal appears, is made shortened, since there is no gate circuit such as a word line driver which does not relate directly to the data read operation. Accordingly, there is provided a bipolar PROM attaining a data read operation at a very high speed.

Figure 3:
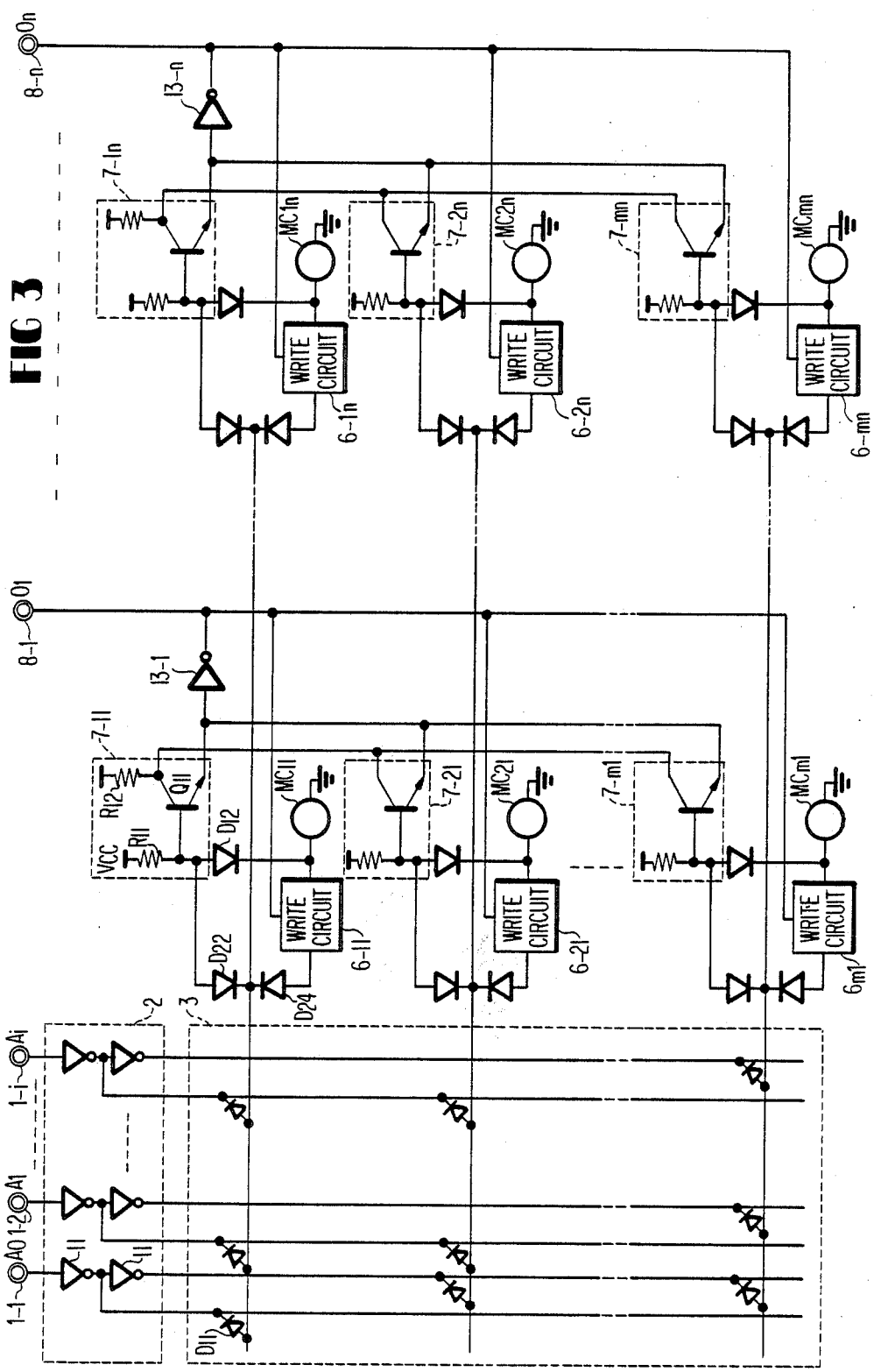
FIG. 3 is a circuit diagram representing another embodiment of the present invention.

FIG. 3 shows another embodiment of the present invention in which the same constituents as those shown in FIG. 2 are indicated by the same reference numerals to omit their further description. In this embodiment, a plurality of memory cells are selected by one output having a selection level from the address decoder 3. For this purpose, diodes $D_{22}$ are provided between one output end of the decoder 3 and the bases of a plurality of reading transistors $Q_{11}$. Each output end of the decoder 3 is further connected to a plurality of the data write circuits 7 through diodes 24, respectively. When the address decoder 3 produces its output with an unselection level (i.e., ground level), the base of each transistor $Q_{11}$ takes the low level irrespective of the data stored in the memory cell MC, $Q_{11}$ being in the cut-off state. The output of the decoder 3 has the selection level, the memory cells MC are selected through the diodes $D_{22}$ and $D_{12}$. The data write or operation is carried out in a manner described with reference to FIG. 2. By the diodes $D_{22}$ and $D_{24}$, the electrical isolation is obtained among the read circuits 6 and among the write circuits 7.

In FIG. 5, a circuit diagram of the output inverter 13 in FIGS. 2 and 3 is shown. The common emitter connection point of the transistors $Q_{11}$ is connected to the base of a transistor $Q_{50}$. The collector of $Q_{50}$ is connected in common to the collector of the transistors $Q_{11}$. The emitter of the transistor $Q_{50}$ is connected to the base of a transistor $Q_{51}$ and further to the base of a transistor $Q_{53}$ through a resistor $R_{52}$. A resistor $R_{51}$ is connected between the base and emitter of the transistor $Q_{50}$. The emitter of the transistor $Q_{51}$ is grounded through a resistor $R_{53}$ and the collector thereof is connected to the power terminal through a resistor $R_{54}$. The collector of $Q_{51}$ is further connected to the base of a transistor $Q_{52}$. The collector of $Q_{52}$ is connected to the power terminal through a resistor $R_{55}$ and the emitter thereof is connected to the output terminal 8 through a diode $D_{50}$ and further to the collector of the transistor $Q_{53}$.

It will be understood from the above circuit construction that the output terminal 8 does not assume the low level unless the voltage above $3V_{BE}$ is applied to the base of the transistor $Q_{11}$. Accordingly, the output terminal 8 takes the high level in the data programmed state of the memory cell MC and the low level in th data non-programmed state.

FIG. 6 shows a detailed circuit of each data write circuit 7. It has already mentioned that the data write circuit 7 is activated only when the programming power is applied to the output terminal 8. In other words, a trigger circuit is required, which detects the level at the output terminal 8 to activate the data write circuit 7. This trigger circuit may be provide in each data write circuit, as shown in FIG. 6A. The output terminal 8 is connected with the emitter of a transistor $Q_{100}$, the base of which is connected to the collectors of transistors $Q_{100}$ and $Q_{102}$. The collector of the transistor $Q_{101}$ is connected to the base of $Q_{101}$ to which the signal is applied from the address decoder 3. A zener diode $ZD_{100}$ is connected between the base and collector of the transistor $Q_{100}$. The emitter of the transistor $Q_{101}$ is connected to the base of $Q_{102}$ and further to the emitter of $Q_{102}$ through a resistor $R_{100}$. The emitter of the transistor $Q_{102}$ is connected to the memory cell MC. When the transistor $Q_{101}$ is applied at its base with the selection signal from the address decoder 3 and the output terminal 8 is supplied with a voltage exceeding the zener voltage of the zener diode $ZD_{100}$ (i.e., the programming voltage), the transistors $Q_{100}$ to $Q_{102}$ are turned ON to supply the programming current to the memory cell. The zener diode $ZD_{100}$ thus constitutes the trigger circuit. When the decoder 3 supplies the unselection signal to the transistor $Q_{101}$, the transistors $Q_{101}$ and $Q_{102}$ are maintained in the cut-off state.

Since a plurality of data write circuits 7 are connected to one output terminal 8, one trigger circuit can be used in common for those data write circuits. This example is shown in FIG. 6B. A series connection circuit of a zener diode $ZD_{101}$ and a plurality of diode $D_{100}$ to $D_{102}$ are used in common for a plurality of data write circuits as a trigger circuit detecting the programming voltage.

As described above, the bipolar PROM according to the present invention reduces the number of the gate circuits operating in a data read mode and thus attains the data read operation at a very high speed.

The present invention is not limited to the above-mentioned embodiments, but changed or modified without departing from the scop and spirit of the invention.

What is claimed is:

1. A memory device comprising address decode means having a plurality of first and second output terminals and responsive to a set of address signals for outputting a first signal at one of said first output terminals and a second signal at one of said second output terminals, a plurality of two-terminal memory cells each having a first cell terminal connected to a reference terminal and a second cell terminal, a plurality of diodes each connected between each of said first output terminals of said address decode means and each of said second cell terminals, at least one data output terminal, a plurality of data read circuits each coupled to each of said first output terminals of said address decode means, one of said data read circuits being activated by said first signal outputted from said one of said first output terminals of said address decode means to transfer data stored in an associated one of said memory cells through an associated one of said diodes to said data output terminal, and a plurality of data write circuits each coupled between each of said second output terminals of said address decode means and each of said second cell terminals, one of said data write circuits being activated by said second signal outputted from said one of said second output terminals of said address decode means, the activated data write circuit supplying a programming current from said data output terminal to an associated one of said memory cells, and one of said diodes connected to said activated data write circuit preventing said programming current from flowing into an associated one of said data read circuits.

2. A memory device comprising address decode means having a plurality of output terminals and responsive to address signals for outputting a decoded signal at one of said output terminals, a plurality of two-terminal memory cells each having a first cell terminal connected to a reference terminal and a second cell terminal, a plurality of data read circuits each having an input terminal, a plurality of first diodes each connected between each of said output terminals of said address decode means and each of said input terminals of said data read circuits, a plurality of second diodes each connected between each of said second cell terminals of said memory cells and each of said input terminals of said data read circuits, a data output terminal, a plurality of data write circuits each having an input terminal connected to said data output terminal, an output terminal connected to said second cell terminal of each memory cell and a control terminal, a plurality of third diodes each connected between each of said output terminals of said address decode means and each of said control terminals of said data write circuits, one of said data write circuits and one of said data read circuits being activated by said decoded signal, the activated data write circuit supplying a programming current from said data output terminal to the associated one of said memory cells, one of said second diodes connected to the activated data read circuit preventing said programming current from flowing into said activated data read circuit, said activated data read circuit reading out data stored in the associated one of said memory cells through said one of said second diodes when said programming current is not supplied to said data output terminal, and means for supplying to said data output terminal the read-out data from said activated data read circuit.

3. The memory device as claimed in claim 1, wherein each of said memory cells comprises a bipolar transistor having a collector connected to said first cell terminal, an emitter connected to said second cell terminal and a base in an open state.

4. The memory device as claimed in claim 1, wherein each of said memory cells comprises a fuse connected between said first and second cell terminals.

5. The memory device as claimed in claim 2, wherein each of said memory cells comprises a bipolar transistor having a collector connected to said first cell terminal, an emitter connected to said second cell terminal and a base in an open state.

6. The memory device as claimed in claim 2, wherein each of said memory cells comprises a fuse connected between said first and second cell terminals.

7. A semiconductor memory, comprising; at least one two-terminal memory cell having a first terminal connected directly to a reference potential and a second terminal, a data write circuit electrically coupled to said second terminal of said memory cell, a data read circuit, and a unidirectional element coupled between said data read circuit and said second terminal of said memory cell, said unidirectional element electrically isolating said data read circuit from said second terminal of said memory cell in a data write mode and electrically coupling said data read circuit to said second terminal of said memory device in a data read mode.

8. The semiconductor memory as claimed in claim 7, wherein said data write circuit supplies a programming voltage to said second terminal of said memory cell in said data write mode and wherein said unidirectional element is reverse-biased by said programming voltage to thereby electrically isolate said data read circuit from said second terminal of said memory device.

9. A memory device comprising at least one memory cell having first and second terminals, conductivity between said first and second terminals of said memory cell being changed from a first state to a second state by directing a programming current through said memory cell, said second state being subsequently maintained substantially permanently, a reference potential terminal, means for directly connecting said first terminal of said memory cell to said reference potential terminal, write means coupled to said second terminal of said memory cell for operatively supplying said programming current to said second terminal of said memory cell, said programming current flowing via said memory cell into said reference potential terminal to thereby change the conductivity between said first and second terminals of said memory cell from said first state to said second state, read means coupled to said second terminal of said memory cell for operatively supplying to said second terminal of said memory cell a reading current having an amplitude that is smaller than said programming current to detect the conductivity state between said first and second terminals of said memory cell, and switching means inserted between said read means and said second terminal of said memory cell for disconnecting said read means from said second terminal of said memory cell in response to said programming current, said switching means connecting said read means to said second terminal of said memory cell when said programming current is not present at the second terminal of said memory cell to allow said reading current to be supplied to said memory cell.

10. The memory device as claimed in claim 9, wherein said memory cell comprises a bipolar transistor having a collector connected to said first terminal, an emitter connected to said second terminal and a floating base, an emitter-base junction of said bipolar transistor being destroyed by said programming current, said first state of conductivity being a low conductivity state, and said second state of conductivity being a high conductivity state.

11. The memory device as claimed in claim 9, wherein said memory cell comprises a fuse connected between said first and second terminals, said fuse being blown by said programming current, said first state of conductivity being a high conductivity state, and said second state of conductivity being a low conductivity state.

12. The memory device as claimed in claim 9, wherein said switching means comprises a diode.

13. A semiconductor memory, comprising; a plurality of memory cells each having first and second terminals, each of said memory cells establishing one of a conductive state and an open state between said first and second terminals thereof in response to a programming current, said established state being maintained substantially permanently upon being established, a reference terminal, said first terminal of each of said memory cells being directly connected to said reference terminal, a plurality of write circuits coupled respectively to said second terminals of said memory cells, means responsive to a set of address signals for activating one of said write circuits, the activated write circuit operatively supplying said programming current to said second terminal of an associated one of said memory cells, said programming current flowing via said associated memory cell into said reference terminal to establish said state between said first and second terminals of said associated memory cell, a plurality of read circuits coupled respectively to said second terminals of said memory cells, means responsive to said set of address signals for activating one of said read circuits, the activated read circuit operatively producing a reading current to detect the state between said first and second terminals of said associated memory cell, said reading current having an amplitude smaller than said programming current, a plurality of switching means each inserted between each of said read circuits and each of said second terminals of said memory cells, said switching means disconnecting said activated read circuit from said second terminal of said associated memory cell in response to said programming current and connecting said activated read circuit to said second terminal of said associated memory cell to allow said reading current to be supplied to said associated memory cell when said programming current is not present at said second terminal of said associated memory cell, said activated read circuit producing, when connected to said associated memory cell, data responsive to the state between said first and second terminals of said associated memory cell, a data output terminal, and means for supplying said data to said data output terminal.

14. The semiconductor memory as claimed in claim 13 wherein each of said memory cells comprises a bipolar transistor having a collector connected to said first terminal, an emitter connected to said second terminal and a floating base, said programming current destroying an emitter-base junction of said bipolar transistor to form said conductive state between said first and second terminals.

15. The semiconductor memory as claimed in claim 13, wherein each of said memory cells comprises a fuse connected between said first and second terminals, said programming current blowing said fuse to form said open state between said first and second terminals.

16. The semiconductor memory as claimed in claim 13, wherein each of said switching means comprises a diode.

* * * * *

UNITED STATES PATENT AND TRADEMARK OFFICE
CERTIFICATE OF CORRECTION

PATENT NO. : 4,729,116

DATED : March 1, 1988

INVENTOR(S) : SATO ET AL

It is certified that error appears in the above-identified patent and that said Letters Patent is hereby corrected as shown below:

Column 2, line 44, delete "bil" and insert --bit--

Column 3, line 5, delete "signal" and insert --signals--

Column 3, line 53, delete "circuit" and insert --circuit--

Column 4, line 26, delete "addres" and insert --address--

Column 5, line 29, delete "th" and insert --the--

Column 6, line 5, delete "scop" and insert --scope--

Signed and Sealed this

Fourteenth Day of February, 1989

Attest:

DONALD J. QUIGG

*Attesting Officer*     *Commissioner of Patents and Trademarks*